United States Patent

Radloff et al.

[19]

[11] Patent Number: 5,808,863

[45] Date of Patent: Sep. 15, 1998

[54] COMPUTER SYSTEM HAVING QUICK-DETACHABLE RECYCLABLE PARTS AND METHOD

[75] Inventors: Tim Radloff; Erica Scholder, both of Austin, Tex.

[73] Assignee: Dell U.S.A., L.P., Austin, Tex.

[21] Appl. No.: 764,718

[22] Filed: Dec. 10, 1996

[51] Int. Cl.⁶ .................................. G06F 1/16; H05K 7/18
[52] U.S. Cl. ........................ 361/683; 174/35 R; 206/480
[58] Field of Search ..................... 361/753, 816, 361/818, 683, 724; 174/35 R, 50.54; 206/320, 480, 477, 493; 364/708.1

[56] References Cited

U.S. PATENT DOCUMENTS

| | | |
|---|---|---|
| 4,825,339 | 4/1989 | Boudon et al. ..................... 174/35 R |
| 5,206,796 | 4/1993 | Thompson et al. ................. 174/35 R |
| 5,227,956 | 7/1993 | Johnson et al. ..................... 361/736 |
| 5,349,132 | 9/1994 | Miller et al. ........................ 174/35 R |
| 5,575,546 | 11/1996 | Radloff . |
| 5,596,487 | 1/1997 | Castaneda et al. ................ 361/814 |
| 5,601,349 | 2/1997 | Holt . |
| 5,646,820 | 7/1997 | Honda et al. ....................... 361/683 |

*Primary Examiner*—Lynn D. Feild
*Attorney, Agent, or Firm*—Haynes and Boone L.L.P.

[57] ABSTRACT

A computer system, or other electronic device, having two parts that are easily attached and quickly detached. One of the parts has a plurality of stakes projecting from one surface thereof, and the other part has a plurality of through openings for receiving the stakes, and a plurality of slots extending adjacent the stakes. The stakes are formed over the other part adjacent the openings to attach the second part to the first part, and a blade can be inserted in the slots to force the second part away from the first part and break the stakes to quickly detach the parts.

20 Claims, 4 Drawing Sheets

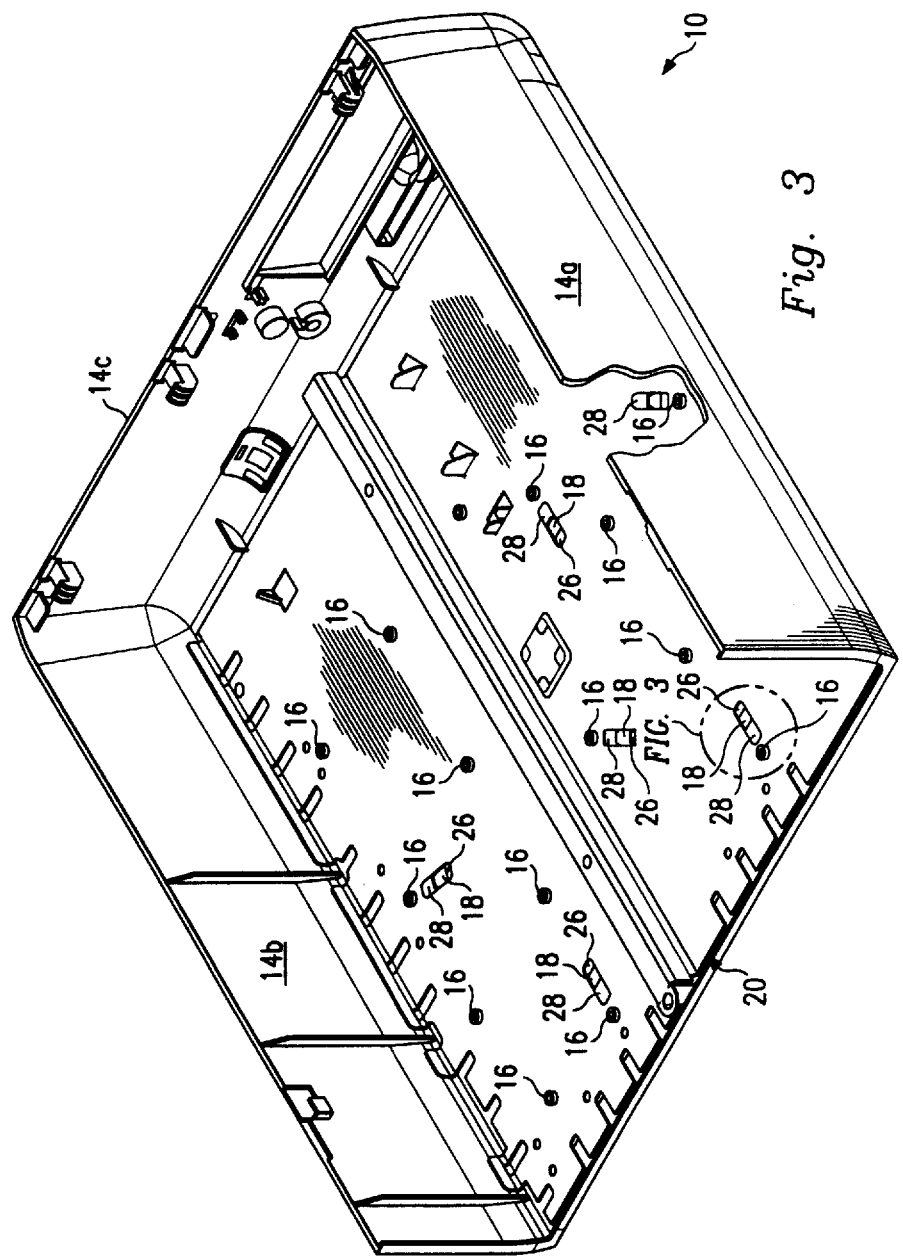

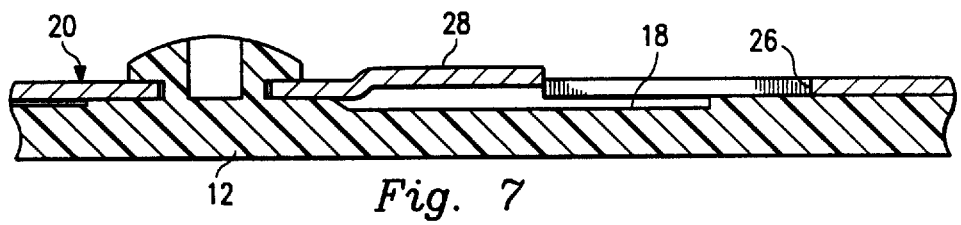
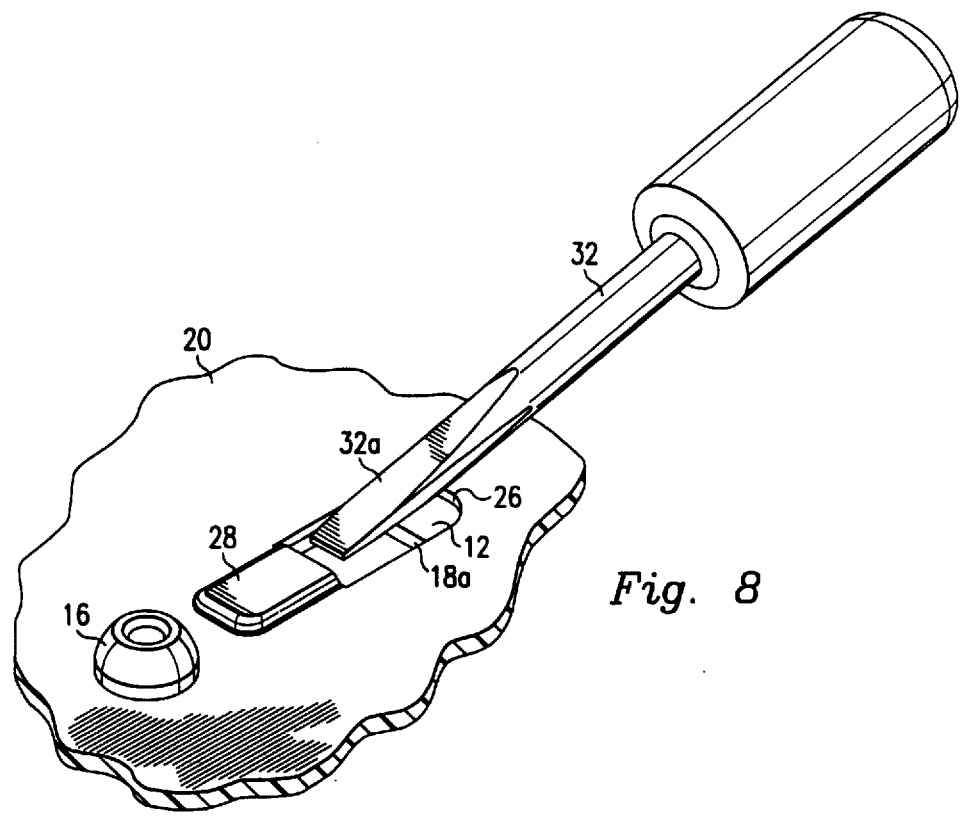

COMPUTER SYSTEM HAVING QUICK-DETACHABLE RECYCLABLE PARTS AND METHOD

TECHNICAL FIELD

The present invention relates generally to computers, or similar electronic devices, and, more particularly, to such devices having quick detachable, recyclable parts, and to a method of assembling and disassembling same.

Recycling of used or worn-out parts is becoming more and more commonplace, especially with the advent of Government standards and requirements requiring same. Many computers and other electronic devices have been designed for ease of assembly with little or no regard as to recyclability. As a result, the several subassemblies making up the device often consist of both recyclable and non-recyclable parts, or recyclable parts that require different recycling processes. As a result, parts that otherwise would be recyclable are prevented from being recycled. Thus, it is becoming more and more important to be able to utilize parts that are easily attached but quickly detached to enable one or both of the parts to be recycled.

Computers, for example, are manufactured and assembled by attaching individual parts together to form subassemblies which, in turn, are built into the final assembly. The individual parts are often fabricated from metal or plastic and are usually attached by screws, heat staking, welds, adhesive, or the like, each of which has advantages and disadvantages with respect to assembly and disassembly. For example, the provision of screws, although making the parts fairly easy to detach, add to the cost of the computer and renders the assembly difficult to automate.

Heat-staking, on the other hand, enables two components, at least one of which is plastic, to be attached with relative ease using no additional parts, adding very little expense and employing automation techniques. Therefore, heat-staking would be a preferred production technique if the assembled parts could be quickly detached to enable one or both of them to be recycled. Unfortunately, heat staking does not lend itself to quick and easy disassembly since the most typical techniques used involve a hammer and chisel, or a motorized cutting tool, all of which are time-consuming and dangerous. Therefore, what is needed is a computer, or other electronic device that has parts that can be attached by a heat staking technique that retains all the above production advantages, yet enables the connected parts to be easily and quickly detached for recycling, or the like.

SUMMARY

Accordingly, a computer system, or other electronic device, having parts that are attached by heat-staking, is provided with all of the advantages thereof, yet can be easily and quickly detached. To this end, one of the parts has a plurality of stakes projecting from one surface thereof. The other part has a plurality of through openings for receiving the stakes, and a plurality of slots extending adjacent the stakes. The stakes are "mushroomed" over the other part adjacent the openings to assemble the parts, and a blade can be inserted in the slots to force the parts apart and break the stakes to quickly detach the parts.

An advantage is thus achieved since the parts can be attached utilizing heat stakes with all of their production advantages, yet the assembled parts can be easily and quickly detached.

BRIEF DESCRIPTION OF THE DRAWINGS

FIG. 3 is a view similar to that of FIG. 2 but showing the two parts of FIG. 2 assembled but before the heat-staking technique is employed.

FIG. 7 is a cross-sectional view taken along the line 7—7 of FIG. 6.

FIG. 8 is a view similar to that of FIG. 6 but depicting a disassembly technique.

DETAILED DESCRIPTION OF THE PREFERRED EMBODIMENT

Figure 2:
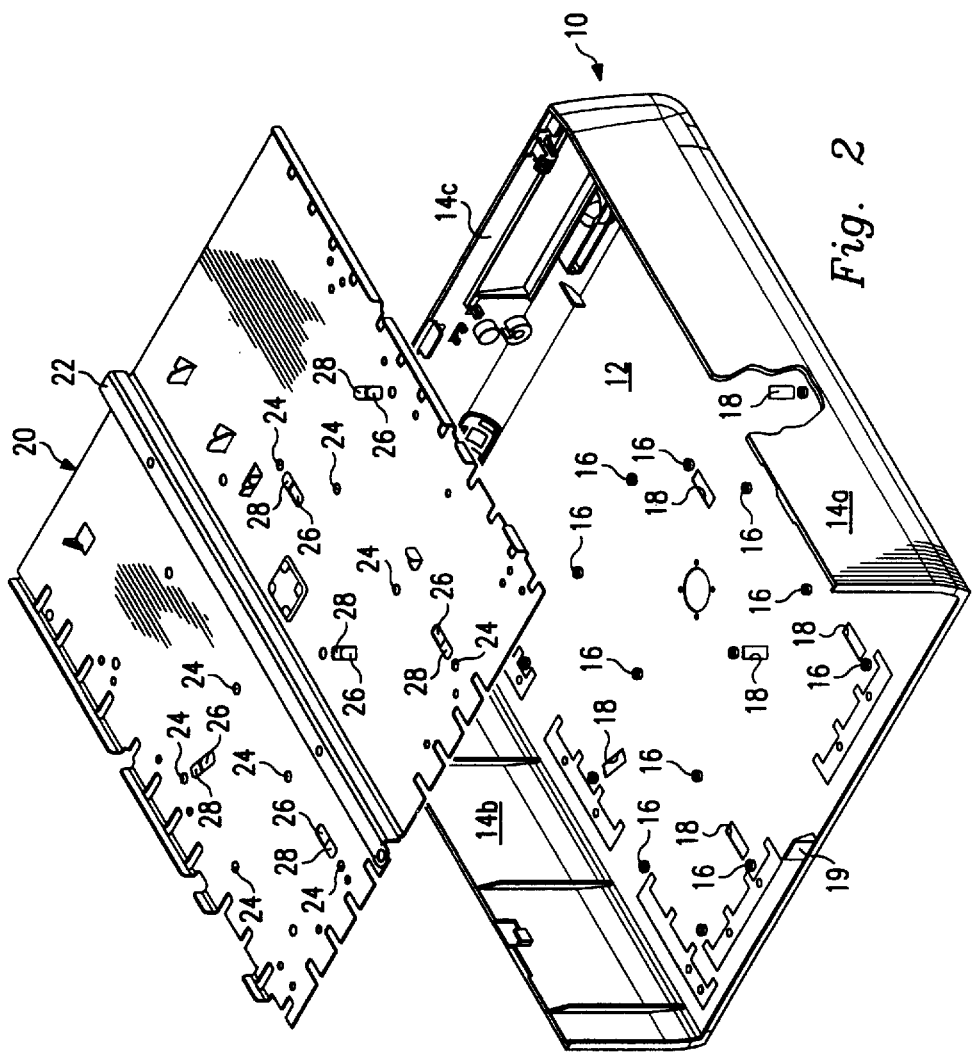
FIG. 2 is an exploded perspective view of a cover/shield assembly designed to cover the chassis of FIG. 1 and which is formed by two parts that are assembled utilizing a heat-staking technique.

A preferred embodiment may be utilized in connection with a personal computer shown in general by the reference numeral 1, which can be in the form of a desktop computer, a laptop computer or a tower computer. The personal computer 1 includes a processor 2, a memory 3, and a plurality of input/output (I/O) devices 4, all contained within a chassis 5. Two buses 6 and 7 are also provided that connect the processor 2 to the memory 3 and to the input/output devices 4, respectively, it being understood that other electrical traces (not shown) are provided for connecting the components of the computer 1. A mother board 8 is also contained in the chassis 5 for mounting and interconnecting various electrical circuits and related devices. Since the computer shown in FIG. 1 is conventional, it will not be described in any further detail.

Figure 1:
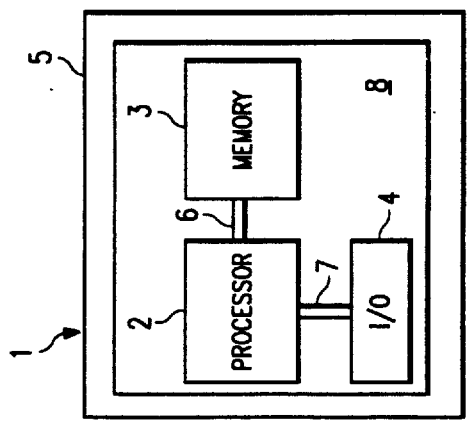
FIG. 1 is a diagram of a computer including a chassis and several components located in the chassis.

FIG. 2 depicts a cover/shield assembly designed to cover the chassis 5 of FIG. 1 and which includes a plastic cover 10, shown upside down for the convenience of presentation. The cover 10 includes a top plate 12, two side walls 14a and 14b, and a front wall 14c extending perpendicular to the top plate. Preferably, the cover 10 is injection molded from a plastic material with the top plate 12 and the walls 14a–14c extending integrally, in a conventional manner.

A plurality of heat stakes 16 are formed on the inner, or lower, surface of the top plate 12 and are also formed of plastic material and integrally with the top plate. The heat stakes 16 are in the form of relatively small hollow posts that project slightly downwardly (upwardly as viewed in FIG. 2) from the plane of the top plate 12 and are spaced along and across the top plate. According to the example of FIG. 2, there are twenty heat stakes 16 so formed on the top plate, it being understood that this number can vary depending on the particular application. An indentation 18 is formed in the lower surface of the top plate 12 adjacent six of the heat stakes 16 and a flange 19, projects downwardly from the top plate 12 adjacent the center portion of the rear end thereof, all for reasons to be described.

A metal shield 20 is also provided that is attached to the inner surface of the top plate 12 and has a length and width that substantially correspond to the length and width of the top plate. The purpose of the shield 20 is to shield against electromagnetic and radio frequency interference and provide structural support to the top plate 12. To the latter end, a central beam 22 extends from front-to-back of the shield 20 and is formed integrally with the shield by bending the center portion of the shield accordingly.

A plurality of openings 24 are provided through the shield 20 in the same spacing pattern as the heat stakes 16 of the top plate 12. The diameters of the openings 24 are slightly larger that the diameters of the heat stakes 16 so as to receive the heat stakes, as will be described. Six slots 26 are provided through the metal shield 20 and correspond in number and location to the indentations 18 formed in the top plate 12 adjacent the corresponding heat stakes 16. The shield 20 also has six embossed portions 28 extending at the respective ends of the slots 26 for reasons to be explained.

To assemble the shield 20 to the cover 10, the shield is initially lowered from its position shown in FIG. 2 to the position of FIG. 3 in which the lower surface (as viewed in FIG. 3) of the shield engages the upper surface of the top plate 12. In this condition, the openings 24 in the shield extend around the respective heat stakes 16 of the cover 12, and the slots 26 formed in the shield align with the respective indentations 18 in the top plate 12. Also, the flange 19 of the cover 12 extends in the rear end of the central beam 22 of the shield.

Figure 4:
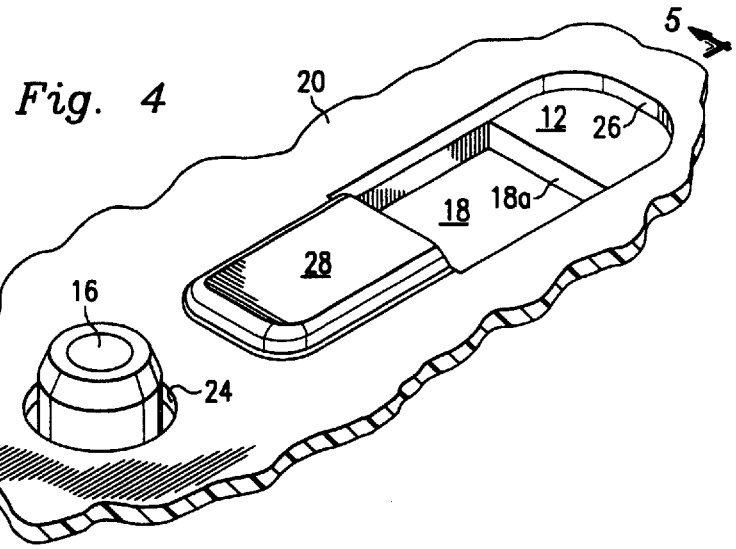
FIG. 4 is an enlarged, partial, perspective view of the portions of the assembled parts shown in the circle in FIG. 3.

FIG. 4 depicts the slot 26, the embossed portion 28 and the heat stake 16 shown in the circle in FIG. 3. It is noted that a shoulder 18a is formed in the top plate 12 as a result of the indentation 18 and is spaced from the end of the slot 26. The slot 26, the embossed portion 28, and the heat stake 16 shown in FIG. 4 are identical to the other slots, embossed portions and heat stakes also shown in FIG. 3.

Figure 5:
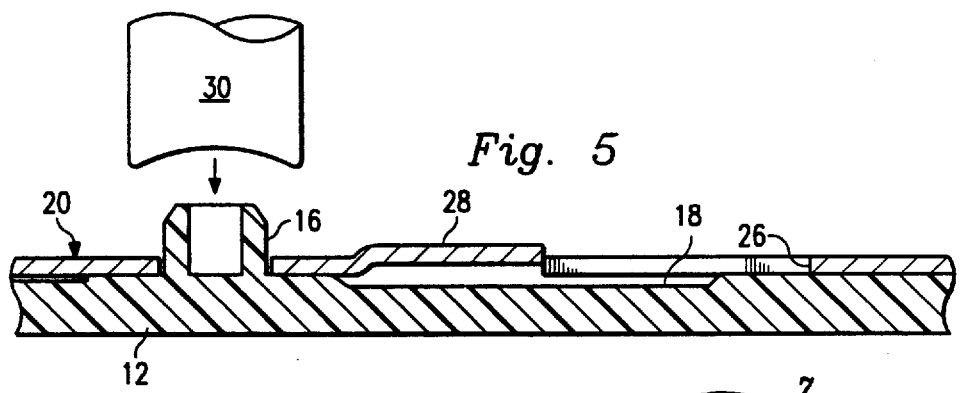
FIG. 5 is a cross-sectional view taken along the line 5—5 of FIG. 4.
Figure 6:
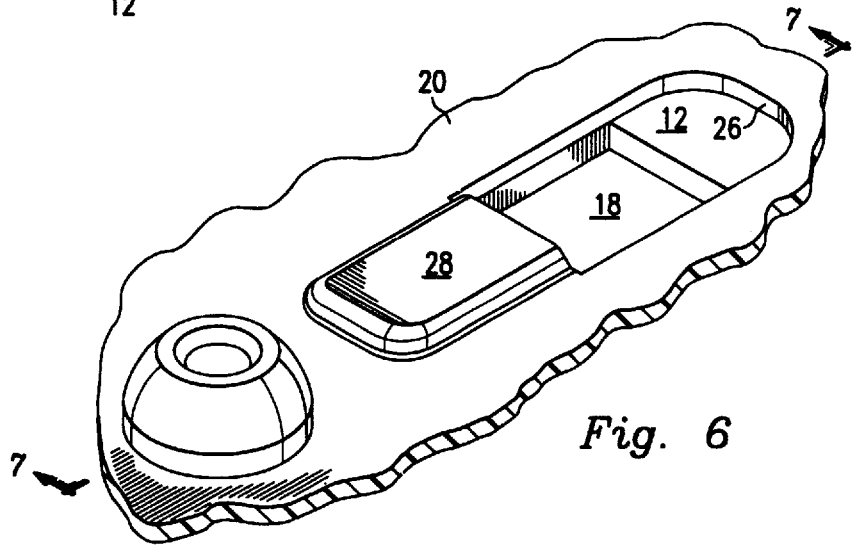
FIG. 6 is a view similar to that of FIG. 4 but showing the two parts of FIG. 2 after the heat-staking technique has been completed.

With reference to FIG. 5, the shield 20 is secured to the cover 10 by an automated machine 30 which is brought down over each heat stake 16. It is understood that the machine 30 is adapted to apply energy, such as heat and pressure, to the heat stake 16 to the extent that the plastic material of the heat stake melts slightly and "mushrooms" over the shield 20 as shown in FIGS. 6 and 7. Since the machine 30 is of a conventional design, it is shown schematically and will not be described in any further detail. This step is repeated with the other five heat stakes 16 that are located adjacent an indentation 18 to further secure the shield 20 to the cover 10. It is noted that the heat stakes 16 which are not adjacent an indentation are not treated in the foregoing manner but extend in their corresponding openings 24 in the shield 20 to guide the shield and prevent lateral movement of the shield relative to the top plate 12. The shield 20 is thus attached to the cover 10 and the cover/shield assembly thus formed can be placed over the chassis 5 (FIG. 1) in a conventional manner.

If it is desirable to recycle the plastic cover 12 and the metal shield 20 after the computer 1 of FIG. 1 is no longer usable, the shield 20 must be disassembled from the cover 10 since they require different recycling processes. To this end, and with reference to FIG. 8, a standard screwdriver 32, having a flat blade 32a, is placed in the position shown in which it rests on the upper edge of the shoulder 18a. The blade 32a is then inserted further into the slot 26 and under the embossed portion 28 of the shield 20. The handle of the screwdriver 32 is then pushed downwardly, causing the blade 32 to pivot about the upper edge of the shoulder 18a thus creating leverage and a mechanical advantage. The blade 32a thus applies an upwardly-directed force (as viewed in FIG. 8) against the embossed portion 28 to force the shield 20 away from the plate 12 so that the "mushroomed" portion of the heat stake 16a is broken off with a relatively small effort. The other "mushroomed" heat stakes 16a are removed in the same manner, thus enabling the shield 20 to be quickly detached from the cover 10 and both the shield and the cover to be recycled separately.

The foregoing embodiment thus enjoys the advantages of using the heat stakes 16a, with their attendant production advantages, while permitting the cover 10 and the shield 20 to be easily connected and quickly disconnected.

It is understood that variations may be made in the foregoing without departing from the scope of the present invention. For example, the present invention is not limited to the assembly and disassembly of a cover and shield but is equally applicable to any other parts of a computer. Also, the present invention is not limited to a computer but can be equally applied to any device having parts that are connected. Also, it is understood that the present invention is not necessarily limited to assembling parts while permitting their disassembly for the purpose of recycling, but rather is equally applicable to any application where easy and quick disassembly is desired. Further, the two parts to be assembled and disassembled do not necessarily have to be made of plastic and metal respectively, but rather can be made of other materials consistent with the objects and achievements of the present invention. Still further, the number of heat stakes, slots, indentations, and embossed portions can be varied within the scope of the invention.

It is understood that other modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A computer system comprising a chassis, a microprocessor mounted to the chassis, a memory operably connected to the microprocessor, and a cover/shield assembly for covering the chassis and shielding against electromagnetic and radio frequency interference, the assembly including a cover having a plurality of deformable stakes projecting from one surface thereof; a shield having formed therein a plurality of through openings for receiving the stakes, and a plurality of slots extending adjacent the stakes; and a plurality of indentations formed in the cover aligned with a portion of the slots to facilitate insertion of a tool through the slots and into the indentations to provide leverage and a mechanical advantage for pivotal movement of the tool, whereby stakes deformed over the shield adjacent the openings to attach the shield to the cover, are breakable by the tool inserted into the slots to force the shield away from the cover.

2. The system of claim 1 wherein the shield also provides structural support.

3. The system of claim 1 wherein the cover is deformed of a plastic material and the stakes are formed over the shield by applying pressure.

4. The system of claim 1 wherein sections of the shield are raised at an end portion of the slots to receive the tool.

5. A computer system comprising: a chassis, a microprocessor mounted to the chassis, a memory operably connected to the microprocessor, and a cover/shield assembly for covering the chassis and shielding against electromagnetic and radio frequency interference, the assembly including a cover having a plurality of deformable stakes projecting from one surface thereof;

a shield having formed therein a plurality of through openings for receiving the stakes, and a plurality of slots extending adjacent the stakes;

sections of the shield being raised at an end portion of the slots to receive a tool; and a plurality of indentations formed in the cover adjacent the openings to facilitate insertion of the tool into the slots and to provide leverage and a mechanical advantage for pivotal movement of the tool, whereby stakes deformed over the shield adjacent the openings to attach the shield to the cover, are breakable by the tool inserted into the slots to force the shield away from the cover.

6. A computer system comprising:

a chassis, a microprocessor mounted to the chassis, a memory operably connected to the microprocessor, and a cover/shield assembly for covering the chassis and shielding against electromagnetic and radio frequency interference, the assembly including a cover having a plurality of deformable stakes projecting from one surface thereof;

a shield having formed therein a plurality of through openings for receiving the stakes, and a plurality of slots extending adjacent the stakes; and a plurality of indentations formed in the cover adjacent the openings to facilitate insertion of a tool into the slots, whereby stakes deformed over the shield adjacent the openings to attach the shield to the cover, are breakable by the tool inserted into the slots to force the shield away from the cover.

7. An assembly for an electronic device, said assembly comprising:

a first part having a plurality of deformable stakes projecting from one surface thereof;

a second part having formed therein a plurality of through openings for receiving the stakes, and a plurality of slots extending adjacent the stakes; and a plurality of indentations formed in the first part aligned with a portion of the slots to facilitate insertion of a tool through the slots and into the indentations to provide leverage and a mechanical advantage for pivotal movement of the tool, whereby stakes deformed over the second part adjacent the openings to assemble the second part to the first part are breakable by the tool inserted in the slots to force the second part away from the first part.

8. The assembly of claim 7 wherein the first part functions as a cover for the electronic device and the second part provides electromagnetic and radio frequency shielding and structural support.

9. The assembly of claim 7 wherein the first part is formed of a plastic material and the stakes are deformed over the second part by applying pressure and heat to the stakes.

10. The assembly of claim 7 wherein sections of the second part are raised at an end portion of the slots to receive the tool.

11. An assembly for an electronic device, said assembly comprising:

a first part having a plurality of deformable stakes projecting from one surface thereof;

a second part having formed therein a plurality of through openings for receiving the stakes, and a plurality of slots extending adjacent the stakes;

sections of the second part being raised at an end portion of the slots to receive a tool; and a plurality of indentations formed in the first part adjacent the openings to facilitate insertion of the tool into the slots and to provide leverage and a mechanical advantage for pivotal movement of the tool, whereby stakes deformed over the second part adjacent the openings to attach the second part to the first part, are breakable by the tool inserted into the slots to force the second part away from the first part.

12. An assembly for an electronic device, said assembly comprising:

a first part having a plurality of deformable stakes projecting from one surface thereof;

a second part having formed therein a plurality of through openings for receiving the stakes, and a plurality of slots extending adjacent the stakes; and a plurality of indentations formed in the first part adjacent the openings to facilitate insertion of a tool into the slots, whereby the stakes deformed over the second part adjacent the openings to assemble the second part to the first part, are breakable by the tool inserted in the slots to force the second part away from the first part.

13. In combination, a first part having a plurality of deformable stakes projecting from one surface thereof;

a second part having formed therein a plurality of through openings for receiving the stakes, and a plurality of slots extending adjacent the stakes; and a plurality of indentations formed in the first part adjacent the openings to facilitate insertion of a tool into the slots and to provide leverage and a mechanical advantage for pivotal movement of the tool, whereby stakes deformed over the second part adjacent the openings to assemble the second part to the first part, are breakable by the tool inserted in the slots to force the second part away from the first part.

14. The cover assembly of claim 13 wherein the first part functions as a cover for a electronic device and the second part provides electromagnetic and radio frequency shielding and structural support.

15. The combination of claim 13 wherein the first part is formed of a plastic material and the stakes are deformed over the second part by applying pressure and heat to the stakes.

16. The combination of claim 13 wherein sections of the second part are raised at an end portion of the slots to receive the tool.

17. In combination, a first part having a plurality of deformable stakes projecting from one surface thereof;

a second part having formed therein a plurality of through openings for receiving the stakes, and a plurality of slots extending adjacent the stakes;

sections of the second part being raised at an end portion of the slots to receive a tool; and a plurality of indentations formed in the first part adjacent the openings to facilitate insertion of the tool into the slots and to provide leverage and a mechanical advantage for pivotal movement of the tool, whereby stakes deformed over the second part adjacent the openings to assemble the second part to the first part, are breakable by the tool inserted into the slots to force the second part away from the first part.

18. In combination, a first part having a plurality of stakes projecting from one surface thereof;

a second part having formed therein a plurality of through openings for receiving the stakes, and a plurality of slots extending adjacent the stakes; and a plurality of indentations formed in the first part adjacent the openings to facilitate insertion of a tool into the slots, whereby stakes deformed over the second part adjacent the openings to assemble the second part to the first part, are breakable by the tool inserted in the slots to force the second part away from the first part.

19. A method of assembling and disassembling two parts, comprising the steps of:

forming a plurality of stakes on one part;

providing a plurality of openings through the other part for receiving the stakes;

providing a plurality of slots through the other part extending adjacent the stakes;

applying energy to the stakes to force the stakes over the other part adjacent the openings to assemble the other part to the one part;

inserting a tool into the slots to break the stakes and force the other part away from the one part;

forming an embossed section in the other part at end portions of the slots to receive the tool; and forming a plurality of indentations in the one part adjacent the openings to facilitate insertion of the tool into the slots and to provide leverage and a mechanical advantage for pivotal movement of the tool.

20. A method of assembling and disassembling two parts comprising the steps of:

forming a plurality of stakes on one part;

providing a plurality of openings through the other part for receiving the stakes;

providing a plurality of slots through the other part extending adjacent the stakes;

applying energy to the stakes to force the stakes over the other part adjacent the openings to assemble the other part to the one part;

inserting a tool into the slots to break the stakes and force the other part away from the one part; and forming a plurality of indentations in the one part adjacent the openings to facilitate insertion of the tool into the slot.

\* \* \* \* \*

UNITED STATES PATENT AND TRADEMARK OFFICE
CERTIFICATE OF CORRECTION

PATENT NO. : 5,808,863
DATED : September 15, 1998
INVENTOR(S) : Tim Radloff and Erica Scholder It is certified that error appears in the above-identified patent and that said Letters Patent is hereby corrected as shown below:

Claim 3 should read

The system of claim 1 wherein the cover is formed of a plastic material and the stakes are deformed over the shield by applying pressure and heat to the stakes.

Signed and Sealed this

Third Day of August, 1999

Attest:

Attesting Officer

Q. TODD DICKINSON

Acting Commissioner of Patents and Trademarks